United States Patent
Majumdar et al.

[11] Patent Number: 5,834,842
[45] Date of Patent: Nov. 10, 1998

[54] SEMICONDUCTOR DEVICE, SEMICONDUCTOR MODULE, AND RADIATING FIN

[75] Inventors: Gourab Majumdar; Satoshi Mori; Sukehisa Noda; Tooru Iwagami; Yoshio Takagi; Hisashi Kawafuji, all of Tokyo, Japan

[73] Assignee: Mitsubishi Denki Kabushiki Kaisha, Tokyo, Japan

[21] Appl. No.: 957,938

[22] Filed: Oct. 27, 1997

Related U.S. Application Data

[63] Continuation of Ser. No. 671,721, Jun. 28, 1996, abandoned.

[30] Foreign Application Priority Data

Jan. 17, 1996 [JP] Japan ................................. 8-005749

[51] Int. Cl.⁶ ........................................... H01L 23/28
[52] U.S. Cl. ........................ 257/718; 257/796; 257/706; 257/675; 257/727
[58] Field of Search .................. 257/718–719, 257/727, 675, 706, 796

[56] References Cited

U.S. PATENT DOCUMENTS

| | | | |
|---|---|---|---|
| 3,930,114 | 12/1975 | Hodge | 174/52 |
| 4,878,108 | 10/1989 | Phelps, Jr. et al. | 257/718 |
| 5,053,852 | 10/1991 | Biswas et al. | 257/751 |
| 5,130,888 | 7/1992 | Moore | 257/727 |
| 5,193,053 | 3/1993 | Sonobe | 257/668 |
| 5,311,060 | 5/1994 | Rostoker et al. | 257/796 |
| 5,430,331 | 7/1995 | Hamzehdoost et al. | 257/796 |

FOREIGN PATENT DOCUMENTS

| | | | |
|---|---|---|---|
| 399447 | 11/1990 | European Pat. Off. | 257/675 |
| 59-99743 | 6/1984 | Japan | 257/718 |
| 59-207645 | 11/1984 | Japan | 257/675 |
| 61-39555 | 2/1986 | Japan | 257/796 |
| 1282846 | 11/1989 | Japan | 257/675 |

OTHER PUBLICATIONS

"Power Transistor Heat Sink Clamp Plate", Joy et al, IBM TDM vol. 26, No. 10A Mar. 1984 pp. 5184–5185.

*Primary Examiner*—Teresa M. Arroyo
*Attorney, Agent, or Firm*—Oblon, Spivak, McClelland, Maier & Neustadt, P.C.

[57] ABSTRACT

A groove (21) is formed on an upper surface of sealing resin (2) in the form of a strip. A device (101) is pressed against a flat surface of a radiating fin (55) by a band plate shaped clamper (61) which is engaged with the groove (21). Due to the engagement of the clamper (61) and the groove (21), movement of the device (101) is limited. Namely, the device (101) is stably fixed to the radiating fin (55). Since the device (101) is fixed to the radiating fin (55) by the clamper (61), no hole for receiving a fastening screw is provided in the sealing resin (2). Therefore, the sealing resin (2) is reduced, whereby miniaturization of the device (101) is implemented. Thus, the device is miniaturized at no sacrifice of radiation efficiency.

15 Claims, 10 Drawing Sheets

SEMICONDUCTOR DEVICE, SEMICONDUCTOR MODULE, AND RADIATING FIN

This application is a Continuation of application Ser. No. 08/671,721, filed on Jun. 28, 1996, now abandoned.

BACKGROUND OF THE INVENTION

1. Field of the Invention

The present invention relates to a semiconductor device comprising a power semiconductor element, and a semiconductor module which is formed by fixing this semiconductor device to radiating means, and more particularly, it relates to an improvement for miniaturizing a semiconductor device.

2. Description of the Background Art

FIG. 17 is a bottom plan view showing a conventional semiconductor device which forms the background of the present invention. This device 150 is a semiconductor device which stores a power semiconductor element and has a DIP type package structure. Various types of elements including the power semiconductor element are embedded by sealing resin 94. The various types of elements are fixed to prescribed portions of a lead frame, and parts of this lead frame outwardly project from side walls of the sealing resin 94 as external terminals 95 and 96.

One major surface of a heat conductive plate-type heat sink 97 for improving radiation efficiency is exposed on the bottom surface of the sealing resin 94. The device 150 is used in a state being fixed to an external radiating fin having a flat surface. At this time, the exposed surface of the heat sink 97 is in contact with the flat surface of the radiating fin. Consequently, heat loss which is generated in the internal power semiconductor element is efficiently dissipated from the heat sink 97 to the radiating fin.

A pair of through holes 99 are opened in the vicinity of edges of the bottom surface of the sealing resin 94, in order to simplify attachment of the device 150 to the radiating fin. The through holes 99 pass through the sealing resin 94 from its upper surface toward its bottom surface, so that screws are inserted in these through holes 99 for simply fastening the device 150 to the radiating fin.

In the conventional device 150, as hereinabove described, the pair of through holes 99 are formed in the sealing resin 94. Therefore, the area of the bottom of the sealing resin 94 is excessively widened by portions corresponding to the through holes 99 and peripheral parts forming the same. Also in a device (not shown) provided with slits passing through the side walls of the sealing resin 94 from its upper surface toward its bottom surface in place of the through holes 99, the area of the sealing resin 94 is similarly excessively widened due to formation of the slits. This also applies to the device having opening screw holes in the bottom surface of the sealing resin 94 to be fitted with screws for fastening the device to the radiating fin.

Namely, the conventional semiconductor device is inevitably enlarged in size so that the same can be attached to a radiating fin for improving radiation efficiency.

SUMMARY OF THE INVENTION

According to a first aspect of the present invention, a semiconductor device comprises an electrically conductive lead frame which is in the form of a plate having first and second major surfaces and provided with a plurality of outwardly projecting external terminals, a power semiconductor element which is fixed to the first major surface, and electric insulating sealing resin for sealing the power semiconductor element and the lead frame so as to outwardly expose the external terminals, and the sealing resin is provided with neither hole nor slit for receiving a screw for fastening the sealing resin to external radiating means.

According to a second aspect of the present invention, the semiconductor device further comprises a heat sink which is heat conductive and in the form of a plate having third and fourth major surfaces and is so provided that the third major surface is opposed to the second major surface with a space, and the sealing resin also seals the heat sink so as to outwardly expose the fourth major surface.

According to a third aspect of the present invention, a retreating portion which is depressed stepwise is formed in a surface of the sealing resin which is opposite to the fourth major surface.

According to a fourth aspect of the present invention, the retreating portion is a groove extending from a first end to a second end of the surface in the form of a strip along a center line equally dividing the surface.

According to a fifth aspect of the present invention, the retreating portion is a depression which is formed in a central portion of the surface.

According to a sixth aspect of the present invention, the retreating portion is formed by two depressions which are separated into opposite ends of the surface.

According to a seventh aspect of the present invention, the lead frame is flat in a region including a portion to which the power semiconductor element is fixed, and the second major surface is outwardly exposed in the region.

According to an eighth aspect of the present invention, the lead frame is flat over all regions excluding the external terminals, and the second major surface is outwardly exposed over all regions.

According to a ninth aspect of the present invention, the lead frame further has a bent portion defining a step between the region and the external terminals, and the bent portion is embedded in the sealing resin.

According to a tenth aspect of the present invention, the semiconductor device further comprises a control semiconductor element for controlling the operation of the power semiconductor element, and the control semiconductor element is fixed to the first major surface in the region.

According to an eleventh aspect of the present invention, the lead frame further has a projection which is uprighted from the first or second major surface in an edge portion forming contours of the first and second major surfaces, and the projection is embedded in the sealing resin.

According to a twelfth aspect of the present invention, the width of a forward end portion of the projection is larger than that of its base portion.

According to a thirteenth aspect of the present invention, the lead frame is divided into a plurality of island regions which are isolated from each other, and the projection is selectively provided in that of the plurality of island regions occupying an area which is in excess of a certain magnitude.

According to a fourteenth aspect of the present invention, a semiconductor module comprises a semiconductor device and a radiating means having heat conductivity and a flat surface, while the semiconductor device comprises a lead frame which is electrically conductive and in the form of a sheet having first and second major surfaces and provided with a plurality of external terminals outwardly projecting, a power semiconductor element which is fixed to the first major surface, a heat sink which is heat conductive and in the form of a plate having third and fourth major surfaces and so provided that the third major surface is opposed to the second major surface with a space, and a sealing resin having electrically insulating properties for sealing the power semiconductor element, the lead frame and the heat sink so as to outwardly expose the external terminals and the fourth major surface, and the fourth major surface is in contact with the flat surface of the radiating means. The semiconductor module further comprises a support member pressing a surface of the sealing resin which is opposite to the fourth major surface against the flat surface, thereby fixing the semiconductor device to the radiating means while keeping the fourth major surface in contact with the flat surface.

According to a fifteenth aspect of the present invention, the support member is a clamper which is in the form of a band plate, and first and second end portions of the clamper are fixed to the radiating means and in contact with the surface respectively.

According to a sixteenth aspect of the present invention, a retreating portion which is depressed stepwise is formed in the surface of the sealing resin, and the second end portion of the clamper is engaged with the retreating portion.

According to a seventeenth aspect of the present invention, the semiconductor module further comprises a circuit substrate to which a circuit element is fixedly connected along with the semiconductor device, and a case for storing the circuit substrate, the radiating means is fixed to the case, and the support member is a clamper which is in the form of a band plate, while first and second end portions of the clamper are fixed to an inner wall of the case and in contact with the surface of the sealing resin respectively.

According to an eighteenth aspect of the present invention, the semiconductor module further comprises a circuit substrate to which a circuit element is fixedly connected along with the semiconductor device, and a case for storing the circuit substrate, the circuit substrate is positioned on a side which is opposite to the radiating means through the semiconductor device and selectively defining an opening in a portion opposed to the surface of the sealing resin, the radiating means is fixed to the case, and the support member is an elastic body which is freely inserted in the opening and having first and second end portions which are fixed to an inner wall of the case and in contact with the surface of the sealing resin respectively.

According to a nineteenth aspect of the present invention, a semiconductor module comprises a semiconductor device and a radiating means having heat conductivity and a flat surface, while the semiconductor device comprises a lead frame which is electrically conductive and in the form of a sheet having first and second major surfaces and provided with a plurality of external terminals outwardly projecting, a power semiconductor element which is fixed to the first major surface, and a sealing resin having electrically insulating properties for sealing the power semiconductor element and the lead frame, the lead frame is flat in a region including a portion to which the power semiconductor element is fixed, the external terminals and the second major surface in the region are outwardly exposed, and the second major surface in the region is bonded to the flat surface of the radiating means through a heat conductive electrically insulating adhesive.

In the device according to the first aspect of the present invention, the sealing resin is provided with neither hole nor slit for receiving a screw, whereby a portion of the sealing resin which has been required for forming such a hole or a slit in a conventional device can be removed. The portion of the sealing resin which has been required for forming a hole or a slit exerts no influence on the radiation property for heat loss which is generated in the power semiconductor element, whereby miniaturization of the device is implemented at no sacrifice of radiation efficiency.

The device according to the second aspect of the present invention comprises the heat sink so that its fourth major surface is exposed, whereby it is possible to improve radiation efficiency for heat loss which is generated in the power semiconductor element by bringing the fourth major surface into contact with a flat surface of external radiation means.

In the device according to the third aspect of the present invention, the stepwise retreating portion is formed on the surface of the sealing resin which is opposed to the fourth major surface, whereby it is possible to bring the fourth major surface into contact with the flat surface of the external radiation means with pressing force by pressing the surface of the sealing resin with the support member which is engaged with the retreating portion. Further, it is possible to limit movement of the device and stably fix the device to the radiation means by engaging the support member with the retreating portion.

In the device according to the fourth aspect of the present invention, the retreating portion is formed as a groove which extends in the form of a strip from the first end to the second end along a center line equally dividing the surface of the sealing resin. Therefore, it is possible to press the device against the external radiation means with unbiased pressing force by employing a band plate shaped clamper which is engaged with this groove.

In the device according to the fifth aspect of the present invention, the retreating portion is formed as a depression which is positioned on the center of the surface of the sealing resin. Therefore, it is possible to press the device against the external radiation means with unbiased pressing force by employing a support member which is engaged with this depression.

In the device according to the sixth aspect of the present invention, the retreating portion is formed as two depressions which are separated into first and second opposite ends of the surface of the sealing resin. Therefore, it is possible to press the device against the external radiation means with unbiased pressing force by employing a pair of support members which are engaged with these depressions. At this time, movement of the device is further limited, whereby stability is further improved.

In the device according to the seventh aspect of the present invention, the lead frame is flat in the region including the portion which is loaded with the power semiconductor element, and the second major surface of this region is exposed to the exterior, whereby an excellent radiation property can be attained by bonding this flat region to the flat surface of the external radiation means through an electrically insulating adhesive.

In the device according to the eighth aspect of the present invention, the lead frame is flat along the overall region excluding the external terminals, whereby the step of fixing various types of elements including the power semiconductor element to the lead frame is easily executable. Namely, the manufacturing efficiency for the device is improved.

In the device according to the ninth aspect of the present invention, the lead frame has the bent portion defining a step between the flat region to which the power semiconductor element is fixed and the external terminals, whereby a space distance between the external terminals and the flat surface can be readily ensured when the flat region is bonded to the flat surface of the external radiation means. Thus, the device can be readily attached to the radiation means. Further, the bent portion is embedded in the sealing resin, whereby separation is hardly caused in the interface between the lead frame and the sealing resin. Namely, reliability of the device is improved.

The device according to the tenth aspect of the present invention comprises the control semiconductor element controlling the operation of the power semiconductor element, whereby the device can be used without connecting the control semiconductor element or a circuit corresponding thereto to the exterior. Namely, usefulness of the device is improved. Further, the control semiconductor element is fixed to the flat region in the lead frame along with the power semiconductor element, whereby these elements can be readily fixed to the lead frame. Namely, the manufacturing efficiency of the device is improved.

In the device according to the eleventh aspect of the present invention, the lead frame comprises the projection which is embedded in the sealing resin, whereby separation on the interface between the lead frame and the sealing resin is suppressed by the projection. Namely, adhesion between the lead frame and the sealing resin is improved, whereby reliability of the device is improved as the result. Further, the projection is provided on an edge portion of the lead frame, whereby the projection can be readily formed by punching and bending.

In the device according to the twelfth aspect of the present invention, the projection has such a shape that the width of the forward end portion is larger than that of the base portion, whereby the projection is effectively stopped on the sealing resin. Thus, the adhesion between the lead frame and the sealing resin is further improved.

In the device according to the thirteenth aspect of the present invention, the lead frame is divided into a plurality of island regions which are isolated from each other and the projection is selectively provided in that of the plurality of island regions occupying an area exceeding a certain magnitude, whereby the island region which may cause interfacial separation is selectively reinforced. Namely, the adhesion between the lead frame and the sealing resin is effectively improved without providing a number of projections.

The module according to the fourteenth aspect of the present invention comprises the radiation means, whereby no external radiation means may be separately mounted. Namely, usefulness of the module is improved. Further, the semiconductor device is fixed to the radiation means by the support member pressing the surface of the sealing resin, whereby neither hole nor slit for receiving a screw for fastening the semiconductor device to the radiation means, which has been required in the conventional semiconductor device are needed. Thus, the sealing resin is reduced as compared with the conventional device, and the semiconductor device is miniaturized.

In the module according to the fifteenth aspect of the present invention, the sealing resin of the semiconductor device is pressed by the band plate shaped clamper having the first end portion which is fixed to the radiation means. Namely, the semiconductor device is fixed to the radiation means by the support member of a simple structure, whereby the module can be readily assembled.

In the module according to the sixteenth aspect of the present invention, the retreating portion is provided on the surface of the sealing resin so that the second end portion of the clamper is engaged with this retreating portion, whereby movement of the semiconductor device is limited. Namely, stable fixation of the semiconductor device to the radiation means is implemented.

In the module according to the seventeenth aspect of the present invention, the sealing resin of the semiconductor device is pressed by the band plate shaped clamper whose first end portion is fixed to the inner wall of the case which is fixedly coupled to the radiation means. Namely, the semiconductor device is fixed to the radiation means by the support member of a simple structure, whereby the module can be readily assembled.

In the module according to the eighteenth aspect of the present invention, the sealing resin of the semiconductor device is pressed by the elastic member, which is freely inserted into the opening of the circuit substrate, having the first end portion fixed to the inner wall of the case which is fixedly coupled to the radiation means. Namely, the semiconductor device is fixed to the radiation means by the support member of a simple structure, whereby the module can be readily assembled.

The module according to the nineteenth aspect of the present invention comprises the radiation means, whereby no external radiation means may be separately mounted. Namely, usefulness of the module is improved. Further, the exposed surface of the flat region of the lead frame which is loaded with the power semiconductor element is bonded to the flat surface of the external radiation means through the electric insulating adhesive, whereby an excellent radiation property can be attained. Further, the sealing resin may be provided with neither hole nor slit for receiving a screw for fastening the semiconductor device to the radiation means which has been required in the conventional semiconductor device, whereby the sealing resin is reduced as compared with the conventional semiconductor device, and miniaturization of the semiconductor device is implemented.

An object of the present invention is to provide a semiconductor device which attains miniaturization while maintaining an excellent radiation property, and a semiconductor module which is formed by fixing such a semiconductor device to radiating means.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

1. First Embodiment

First, a semiconductor device according to an embodiment 1 is described.

1—1. Circuit Structure.

Figure 2:
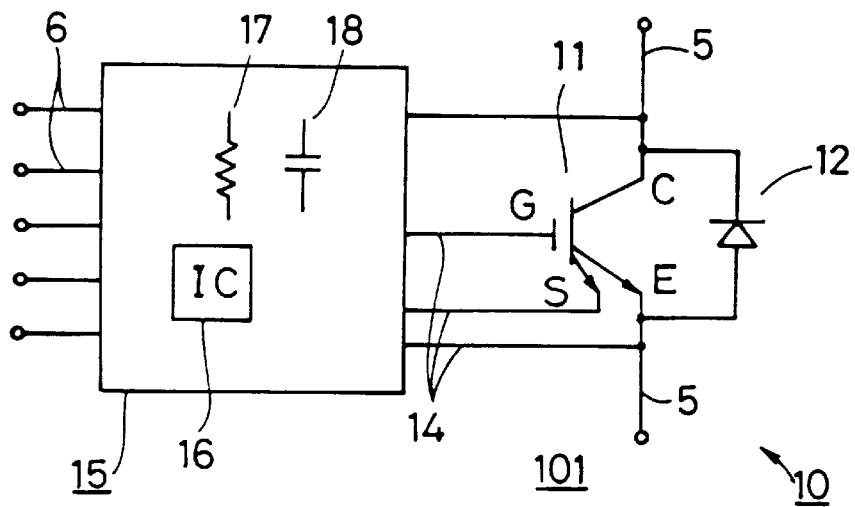
FIG. 2 is a circuit diagram of the device shown in FIG. 1.

FIG. 2 is a circuit diagram showing the circuit structure of the semiconductor device according to the embodiment 1. This device 101 comprises a power circuit 10 having a power semiconductor element which modulates/controls the flow of a main current bearing supply of power to a load, and a control circuit 15 which controls the operation of this power semiconductor element. The device 101 comprises the power semiconductor element accompanied with heat generation, and hence consideration on structure is so made that heat loss which is generated in the power semiconductor element can be effectively dissipated to the exterior, as described later.

In addition to an IGBT element 11 serving as the power semiconductor element, the power circuit 10 comprises a freewheel diode 12. The IGBT element 11 allows conduction of and cuts off (i.e., switches) the main current flowing from a collector electrode C to an emitter electrode E. This main current is supplied to an external load through external terminals 5 which are connected with the collector electrode C and the emitter electrode E. The freewheel diode 12 which is connected in antiparallel with the IGBT element 1 is adapted to protect the IGBT element 11 against breakage caused by application of an excessive reverse voltage.

The control circuit 15 which is coupled to the power circuit 10 through a plurality of wires 14 comprises, a control semiconductor element 16 as an integrated circuit element playing a central role in control of the IGBT element 11, together with a resistive element 17, a capacitive element 18, and the like. These elements form a driving circuit and a protective circuit. The driving circuit is a circuit part in the control circuit which transmits a gate voltage signal to the gate electrode G in response to a control signal inputted to one of a plurality of external terminals 6. The protective circuit is a circuit part which monitors the operation environment of the IGBT element 11 and prevents the IGBT element 11 from damage upon occurrence of abnormality.

The protective circuit illustrated in FIG. 2 monitors the voltage across the collector electrode C and the emitter electrode E, i.e., the collector-to-emitter voltage, and drives the gate electrode G when this voltage becomes excessive beyond a prescribed reference value, in order to cut off the IGBT element 11 regardless of the external control signal. This protective circuit further monitors a feeble current flowing through a sense electrode S in proportion to the main current flowing through the IGBT element 11, i.e., a sense current, and drives the gate electrode G when the main current becomes excessive beyond a prescribed reference value, in order to cut off the IGBT element 11 regardless of the external control signal.

In addition, the protective circuit shown in FIG. 2 transmits a signal reporting occurrence of abnormality to the exterior through the external terminals 6 when an overvoltage or an overcurrent takes place. Thus, the protective circuit fills the role of protecting the IGBT element 11 against damage resulting from abnormality such as an overvoltage or an overcurrent, for example.

1-2. Overall Structure.

Figure 3:
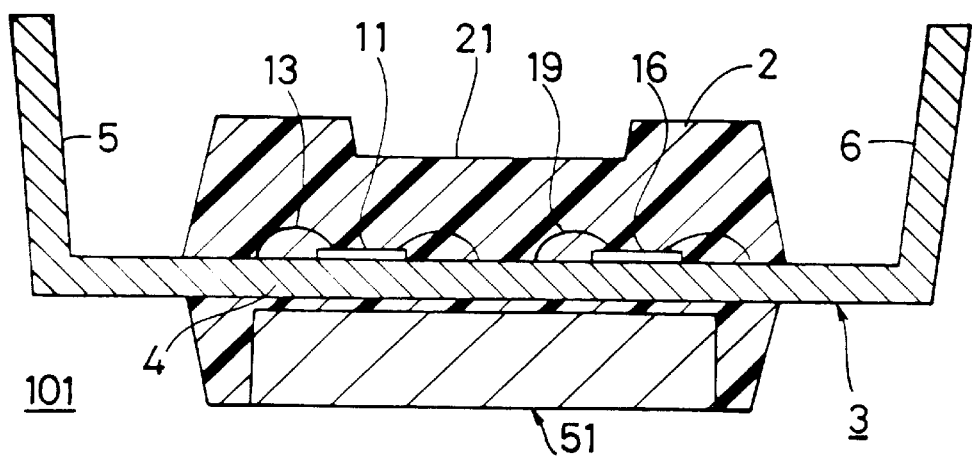
FIG. 3 is a front sectional view of the device shown in FIG. 1.

FIG. 3 is a front sectional view of the device 101. As shown in FIG. 3, various types of elements included in the control circuit 15 and the power circuit 10 are soldered to a plurality of portions on a sheet-type lead frame 3 which substantially consists of an electrically conductive metal such as copper. FIG. 3 draws the IGBT element 11 and the control semiconductor element 16 as representatives among these elements. These elements are preferably formed as bare chip elements, as illustrated in FIG. 3.

The IGBT element 11 is electrically connected with another portion of the lead frame 3 by a bonding wire 13 of aluminum, for example. Similarly, the control semiconductor element 16 is electrically connected with still another portion of the lead frame 3 by a bonding wire 19 of gold, for example. The lead frame 3 forms a wiring pattern 4 of the control circuit 15 and the power circuit 10 including the wires 14, as well as the external terminals 5 and 6.

A plate-type heat sink 51 substantially consisting of a heat conductive metal such as aluminum or copper, for example, is provided to be opposed to the lower major surface of the lead frame 3 which is opposite to the upper major surface (element carrying surface) of the lead frame 3 loaded with the various types of elements. Electrically insulating heat conductive sealing resin 2 seals the portion of the wiring pattern 4 of the lead frame 3, the various types of elements loaded on the wiring pattern 4, and the heat sink 51.

A clearance is slightly defined between the lead frame 3 and the heat sink 51, and this clearance is filled up with the sealing resin 2. The sealing resin 2 filling up the clearance is adapted to electrically insulate the lead frame 3 from the heat sink 51 as well as to excellently transmit heat loss which is generated in the IGBT element 11 from the lead frame 3 to the heat sink 51. The sealing resin 2 is also adapted to fixedly couple the lead frame 3 with the heat sink 51, as well as to protect the wiring pattern 4 and the various types of elements provided thereon against external moisture and the like.

A groove (retreating portion) 21 is formed on the upper surface of the sealing resin 2. A clamper for fixing the device 101 to an external radiating fin is inserted in this groove 21, as described later.

Figure 4:
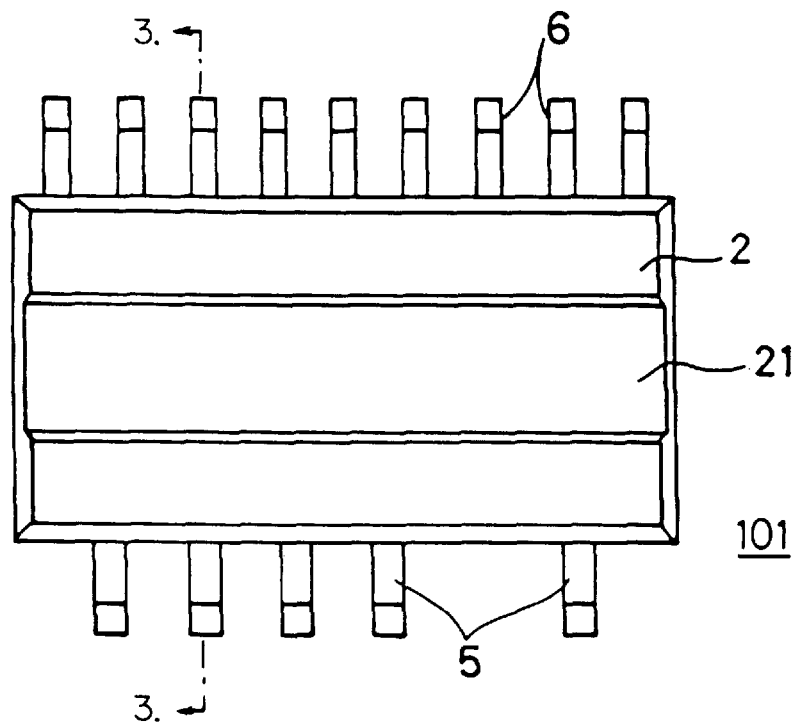
FIG. 4 is a plan view of the device shown in FIG. 1.

FIG. 4 is a plan view of the device 101. The aforementioned FIG. 3 corresponds to a sectional view taken along the line A—A in FIG. 4. As shown in FIG. 4, the external terminals 5 and 6 which are arranged in two lines outwardly project from side walls of the sealing resin 2. The strip-shaped groove 21 is formed on the upper surface of the sealing resin 2 to extend across the same from a first end to a second end along a center line dividing the upper surface into two strip-shaped regions along the external terminals 5 and 6 respectively. The groove 21 is simultaneously formed when the sealing resin 2 is sealed with a mold. Namely, the steps of fabricating the device 101 require no specific step for forming the groove 21.

Figure 5:
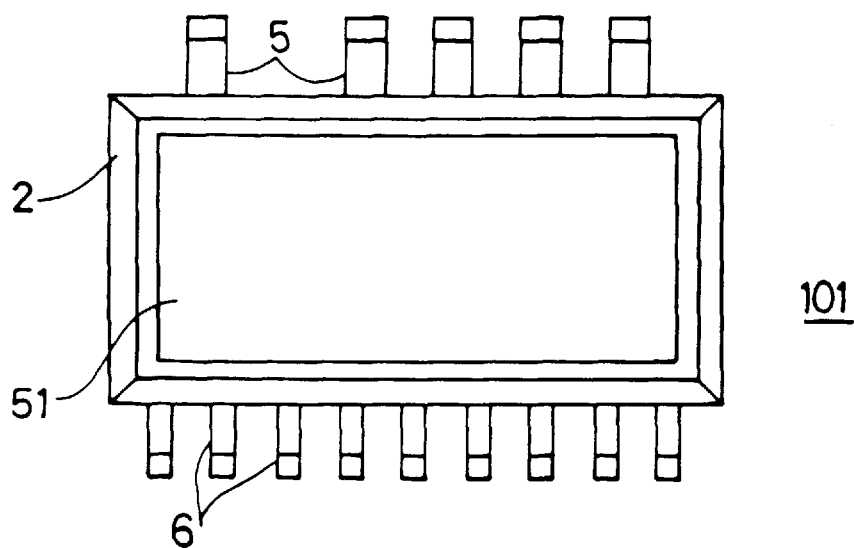
Figure 17:
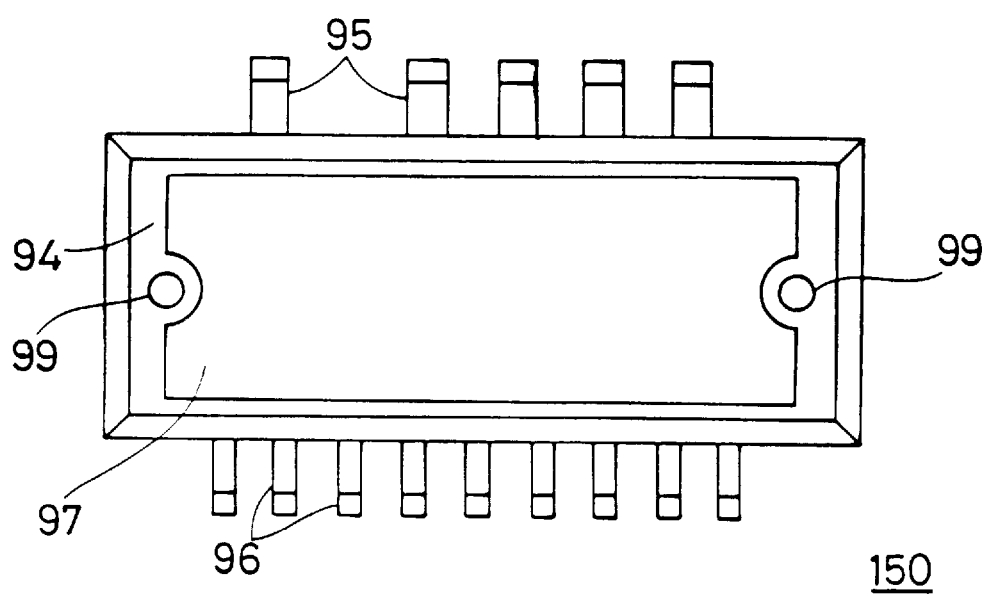
FIG. 17 is a bottom plan view of a conventional device.

FIG. 5 is a bottom plan view of the device 101. As shown in FIG. 5, the lower major surface of the heat sink 51, i.e., the major surface opposite to the upper major surface which is opposed to the lead frame 3, is exposed on the bottom surface of the sealing resin 2. The device 101 is provided with no through holes 99 which have been required in the conventional device 150. As described later, the groove 21 contributes to fixation between the device 101 and a radiating fin (radiation means) 55 in place of the through holes 99. Thus, portions of the sealing resin 2 which have been required for forming the through holes 99, i.e., peripheral portions of the through holes 99, are omitted, as clearly understood by comparing FIGS. 5 and 17 with each other.

Namely, the area of the bottom of the sealing resin 2 is reduced in the device 101 as compared with the conventional device 150, whereby the device 101 is miniaturized. Further, the portions of the sealing resin 2 around the through holes 99 do not contribute to heat radiation in the device 150, and hence radiation efficiency of the device 101 is not inferior to that of the device 150. Further, miniaturization of the device 101 is thus achieved in the device 101 while maintaining a high radiation property similarly to the device 150.

1-3. Use Mode.

Figure 1:
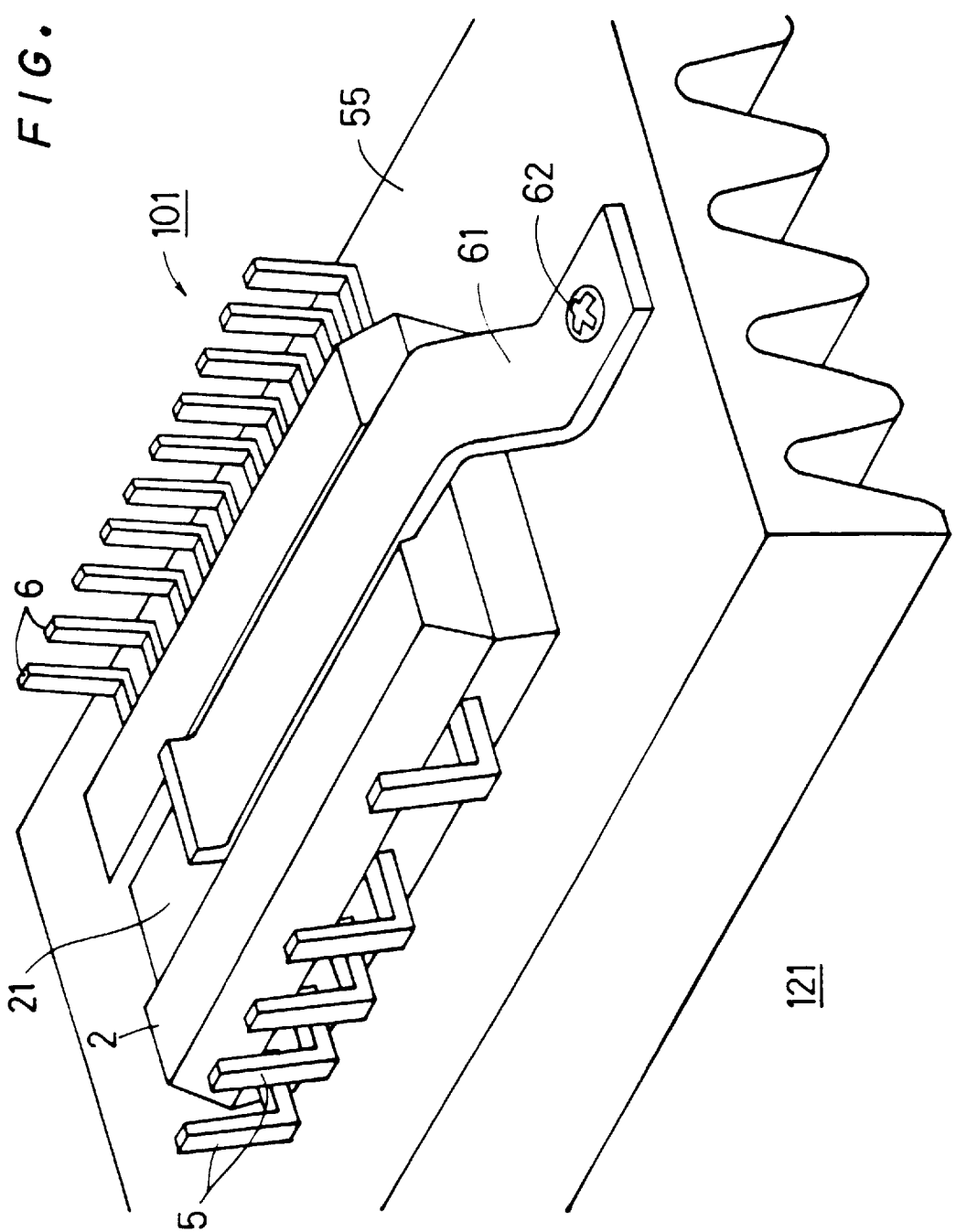
FIG. 1 is a perspective view of a device and a module according to an embodiment 1.

FIG. 1 is a perspective view showing the use mode of the device 101. As shown in FIG. 1, the device 101 is fixed to the external radiating fin 55 in an ordinary use mode. The radiating fin 55 is made of a heat conductive material such as aluminum, and has a flat surface. The device 101 is so fixed to the radiating fin 55 that the exposed surface of the heat sink 51 is in contact with the flat surface. Consequently, heat loss which is generated in the IGBT element 11 is transmitted from the heat sink 51 to the radiating fin 55, thereby being efficiently dissipated to the exterior.

The device 101 is fixed to the radiating fin 55 by a clamper(support member) 61. The clamper 61, which is a band plate shaped member consisting of a metal having a certain elasticity, for example, is bent substantially in the form of a S or substantially stepwise. A first end portion thereof is fixed to the flat surface of the radiating fin 55 by a screw 62, while a second end portion linearly extends along the groove 21. The transverse width of the second end portion, i.e., the width in the direction perpendicular to the longitudinal direction, is set to be identical to or slightly narrower than that of the groove 21, whereby the second end portion is engaged with the groove 21. The clamper 61 presses the bottom surface of the groove 21 against the flat surface of the radiating fin 55 by its elastic restoring force.

Thus, the device 101 is pressed against the radiating fin 55 by the clamper 61, whereby the heat sink 51 and the radiating fin 55 are kept in excellent thermal contact with each other. Further, the band plate shaped clamper 61 is engaged with the groove 21, whereby movement of the device 101 with respect to the radiating fin 55 is limited. In particular, the groove 21 is formed along the center line dividing the upper surface of the sealing resin 2 into two parts, whereby the pressing force exerted by the clamper 61 on the device 101 is unbiased and the device 101 is stably fixed. Further, the clamper 61 extends along a space which is held between the two lines of external terminals 5 and 6, not to interfere with these external terminals 5 and 6.

The device 101 is completely fixed to the radiating fin 55 by simply mounting the clamper 61 having a simple structure to be engaged with the groove 21. Namely, the step of fixing the device 101 to the radiating fin 55 is simple similarly to the step of fixing the conventional device 150. Thus, the device 101 achieves miniaturization without deteriorating not only of the radiation efficiency but simplicity of attachment to the radiating fin 55, as compared with the conventional device 150. Following the miniaturization of the device 101, a larger number of devices 101 can be produced from a single mold in the step of sealing with the sealing resin 2. Namely, productivity is improved. This contributes to reduction of the fabrication cost for the device 101.

An applied device which is formed by fixing the device 101 to the radiating fin 55 by the clamper 61 can be brought into a product as a semiconductor module 121. The semiconductor module 121 has high usefulness of implementing an excellent radiation property without separately requiring a radiating fin.

2. Second Embodiment

Figure 6:
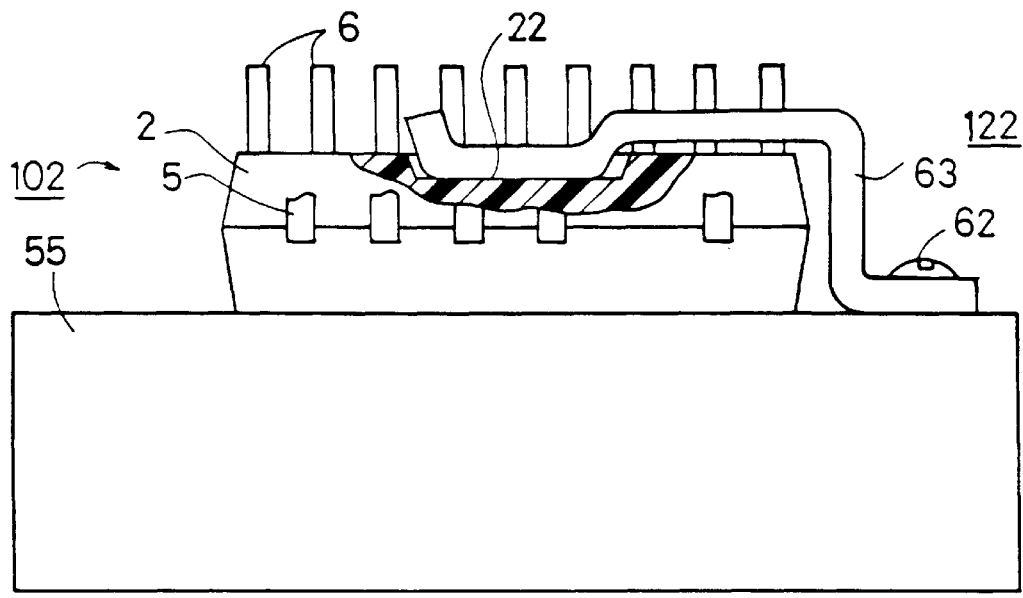
FIG. 6 is a partially fragmented side elevational view showing a device and a module according to an embodiment 2.

FIG. 6 is a partially fragmented side elevational view showing a device 102 which is a semiconductor device according to a second embodiment and a semiconductor module 122 into which this device 102 is integrated. In the following figures, portions identical to those of the device and the module according to the first embodiment shown in FIGS. 1 to 5 or corresponding portions (portions having the same functions) are denoted by the same reference numerals, to omit redundant description.

The device 102 is characteristically different from the device 101 in a point that a depression (retreating portion) 22 is provided in place of the groove 21. The depression 22 is provided at a substantially central portion of an upper surface of sealing resin 2. A clamper(support member) 63 for fixing the device 102 to a radiating fin 55 is in the form of a band plate similarly to the clamper 61, and its first end portion is fastened to the radiating fin 55 by a screw 62, while its second end portion is engaged with the depression 22 and presses the bottom surface of the depression 22 by elastic restoring force.

The clamper 63 is further bent stepwise in a portion positioned above the sealing resin 2, to be in contact with only the bottom surface of the depression 22 on the upper surface of the sealing resin 2, while being separated from portions other than the depression 22. Thus, the device 102 is fixed by the clamper 63 which is engaged with the depression 22, whereby movement of the device 102 along a flat surface of the radiating fin, not only rotary movement but translation movement in any direction, is limited.

Namely, the movement of the device 102 with respect to the radiating fin 55 is further effectively suppressed. In particular, the depression 22 is formed on the substantially central portion of the upper surface of the sealing resin 2, whereby pressing force exerted by the clamper 63 on the device 102 is unbiased and the device 102 is stably fixed.

3. Third Embodiment

Figure 7:
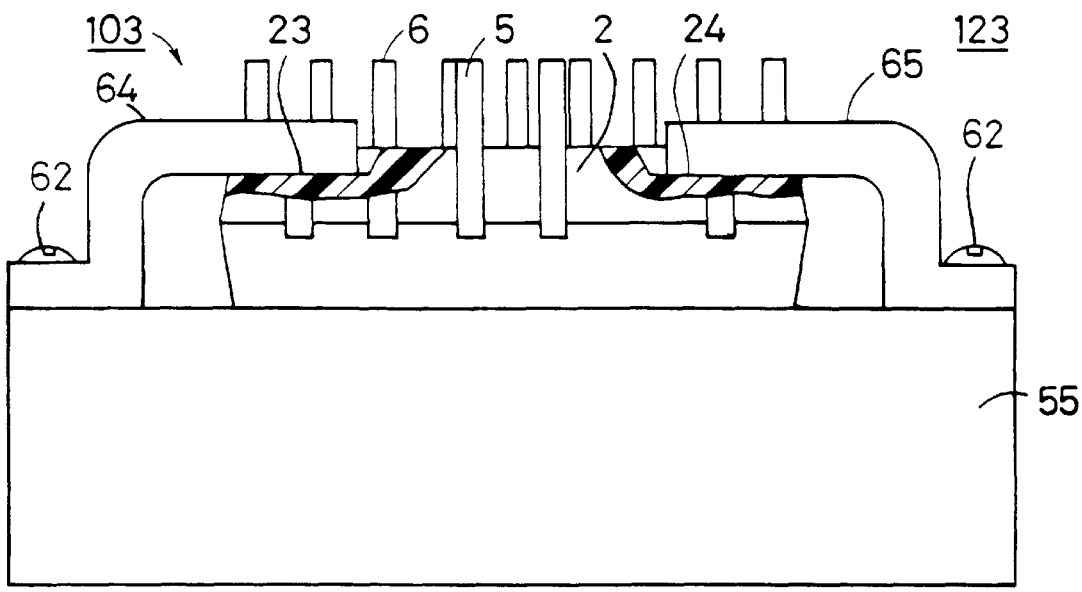
FIG. 7 is a partially fragmented side elevational view showing a device and a module according to an embodiment 3.

FIG. 7 is a partially fragmented side elevational view showing a device 103 which is a semiconductor device according to a third embodiment and a semiconductor module 123 into which this device 103 is integrated. In the device 103, two strip-shaped grooves(depression, retreating portion) 23 and 24 are formed along a center line dividing an upper surface of sealing resin 2 into two strip-shaped regions along external terminals 5 and 6 respectively to be separated on both end portions of the center line.

The device 103 is fixed to a radiating fin 55 by clampers (support member) 64 and 65 which are engaged with the grooves 23 and 24 respectively while pressing bottom surfaces thereof by elastic restoring force. First end portions of the clampers 64 and 65 are fastened to the radiating fin 55 by screws 62, similarly to the clamper 61.

Thus, the device 103 is supported in two portions positioned on both end portions of the center line, whereby movement with respect to the radiating fin 55 is further effectively suppressed. At the same time, pressing force exerted by the clampers 64 and 65 on the device 103 is unbiased, whereby the device 103 is stably fixed.

4. Fourth Embodiment

Figure 8:
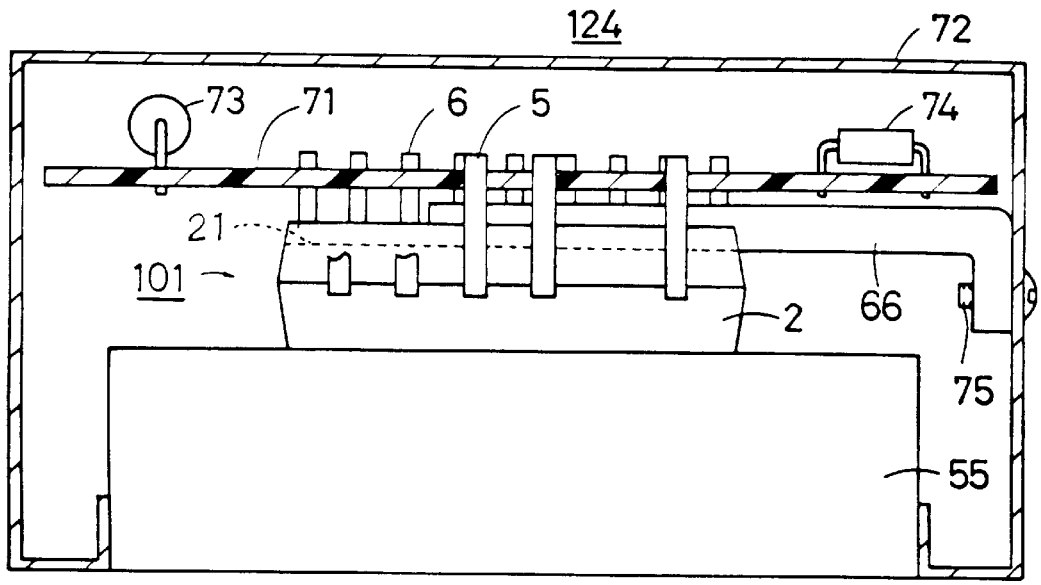
FIG. 8 is a side sectional view of a module according to an embodiment 4.

FIG. 8 is a side sectional view showing a module 124, which is another example of a semiconductor module into which the device 101 according to the first embodiment is integrated. In addition to the device 101 and the radiating fin 55, this module 124 further comprises a circuit substrate 71 and a case 72. The device 101 is fixed to the radiating fin 55 by a clamper 66 having a first end portion which is fixed to the inner wall of the case 72.

The circuit substrate 71 has a prescribed wiring pattern (not shown) corresponding to a desired function of the module 124. The circuit substrate 71 is loaded with various types of circuit elements 73 and 74 corresponding to the function of the module 124, along with the device 101. For example, these circuit elements 73 and 74 are a resistive element and a capacitive element respectively.

The circuit elements 73, 74 and the device 101 are set on a first major surface (upper major surface) and a second major surface (lower major surface) of the circuit substrate 71 respectively. Thus, the radiating fin 55 can be coupled with the device 101 without interfering with the circuit elements 73 and 74.

An opening is selectively provided in the bottom surface of the case 72, so that the radiating fin 55 is inserted in this opening to be fixed to the case 72. Thus, the radiating fin 55 is exposed to the exterior of the case 72 on a side opposite to a flat surface to which the device 101 is fixed.

The first end portion of the band plate shaped clamper (support member) 66 which is bent in the form of a L is fixed to the inner side wall of the case 72. A second end portion of the clamper 66 is engaged with a groove 21 similarly to the clamper 61 in the module 121 according to the first embodiment, and presses the bottom surface of the groove 21 against the radiating fin 55 by elastic restoring force. Thus, fixation between the device 101 and the radiating fin 55 is implemented. The circuit substrate 71 is not directly fixed to the case 72, but fixedly coupled to the case 72 through the device 101 and the radiating fin 55.

The module 124 further comprises terminals (not shown) which can be connected with an external power source and a load, thereby forming an invertor, for example. Thus, the module 124 implements efficient heat radiation by comprising the radiating fin 55, and implements a desired function corresponding to an applied device of the device 101 by further comprising the circuit substrate 71 and the various types of elements 73 and 74.

A step of fixing the device 101 to the radiating fin 55 by the clamper 66 is simple similarly to the step of fixing the device 101 by the clamper 61. Namely, this module 124 can also be readily assembled with a miniaturized semiconductor device, similarly to the modules 121 to 123.

5. Fifth Embodiment

Figure 9:
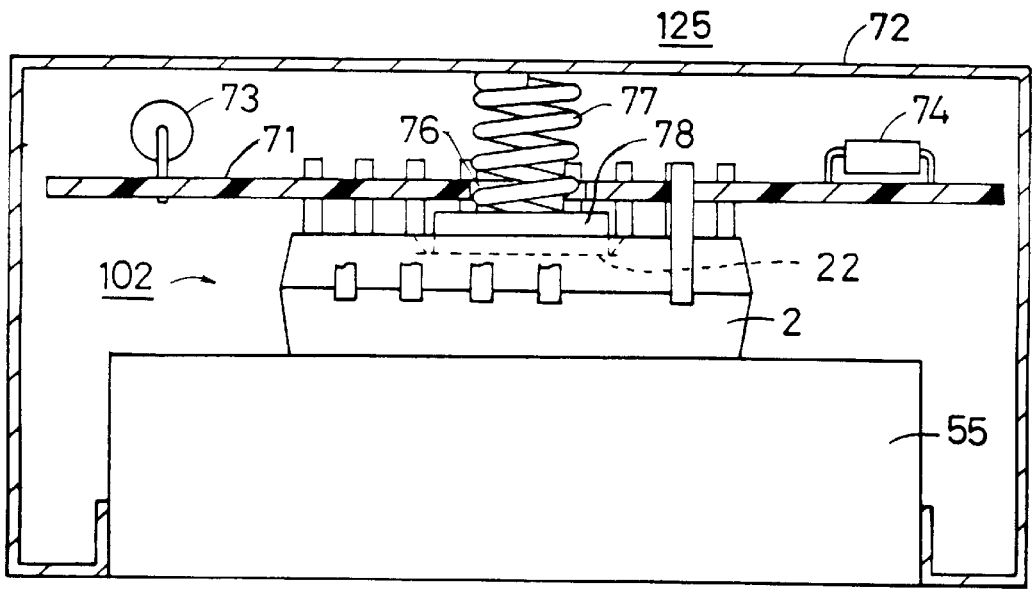
FIG. 9 is a side sectional view of a module according to an embodiment 5.

FIG. 9 is a side sectional view showing a module 125, which is another example of a semiconductor module into which the device 102 according to the second embodiment is integrated. Also this module 125 further comprises a circuit substrate 71 and a case 72 in addition to the device 102 and a radiating fin 55, similarly to the module 124.

In the module 125, the device 102 is fixed to the radiating fin 55 by a spring (elastic body) 77 having a first end portion which is fixed to the inner wall of the case 72. A plate-type member 78 is inserted in a depression 22 which is formed in an upper surface of sealing resin 2. An opening 76 is selectively provided in a portion of the circuit substrate 71 corresponding to a portion immediately above the depression 22.

The spring 77 is freely inserted in the opening 76, so that its first end portion is fixed to a portion of an upper inner wall of the case 72 corresponding to a portion immediately above the depression 22 while its second end portion is fixed to the plate-type member 78. The spring 77 presses the plate-type member 78 against the radiating fin 55 by its elastic restoring force. Namely, the device 102 is fixed to the radiating fin 55 by pressing force of the spring 77.

A step of fixing the device 102 to the radiating fin 55 by the spring 77 is simple similarly to the step of fixing the device 101 by the clamper 61. Namely, this module 125 can also be readily assembled with a miniaturized semiconductor device, similarly to the modules 121 to 123.

Further, the device 102 employed for the module 125 according to this embodiment is not restricted to a DIP type, but may alternatively have a package structure such as a four-way flat package structure, for example, in which external terminals 5 and 6 project from all side walls of the sealing resin 2.

6. Sixth Embodiment

Figure 10:
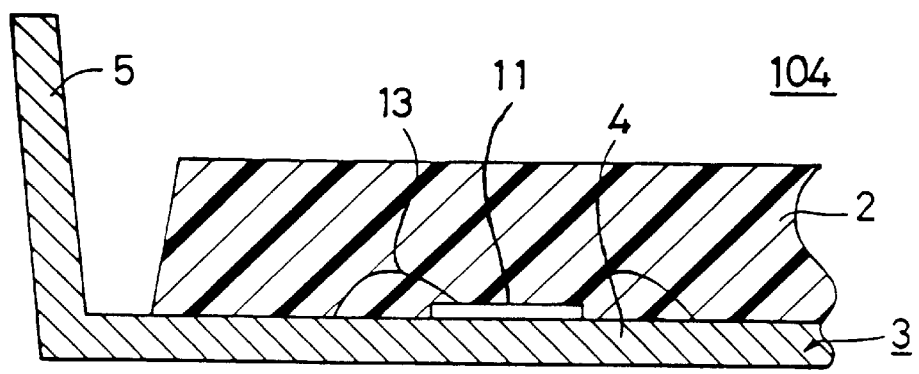
FIG. 10 is a front sectional view of a device according to an embodiment 6.

FIG. 10 is a front sectional view showing a device 104 which is a semiconductor device according to a sixth embodiment. In this device 104, a heat sink 51 is removed and a part of a lead frame 3 forming a wiring pattern 4 is substitutionally exposed to the exterior. Namely, a major surface of the wiring pattern 4 being opposite to an element carrying surface to which an IGBT element 11 and the like are fixed is not covered with sealing resin 2 but exposed.

Figure 11:
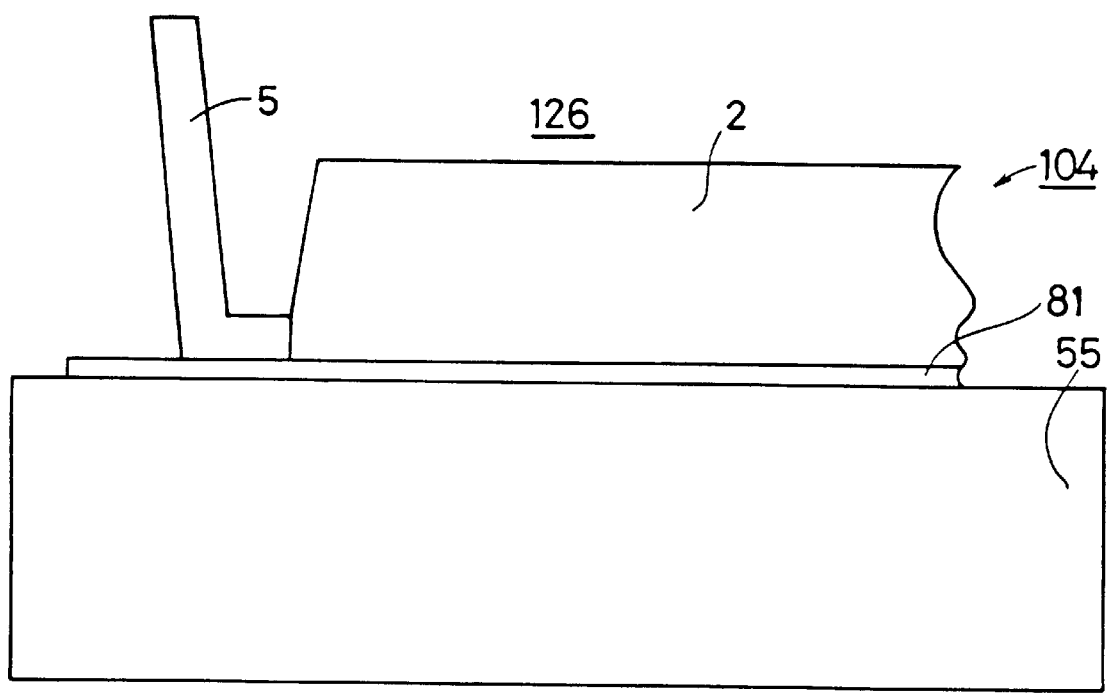
FIG. 11 is a front elevational view of a module according to the embodiment 6.

FIG. 11 is a front elevational view showing a use mode of this device 104. As shown in FIG. 11, the exposed surface of the lead frame 3 is fixed to a flat surface of a radiating fin 55 through a heat conductive electrically insulating adhesive 81 in a preferred use mode of the device 104. Namely, the device 104 is fixed to the radiating fin 55 while simultaneously maintaining electric insulation and heat conductivity between the lead frame 3 and the radiating fin 55 through a simple step employing the adhesive.

The device 104 requires no through holes 99, whereby an area occupied by the sealing resin 2 is reduced similarly to the devices 101 to 103. Further, the heat sink 51 is removed with presence of no portion of the sealing resin 2 which is filled up between the heat sink 51 and the lead frame 3, whereby the height of the device is also reduced. Namely, miniaturization is remarkably attained in the device 104 as compared with any of the devices 101 to 103. Further, the head frame 3 is in contact with the radiating fin 55 through only the adhesive 81, whereby radiation efficiency is also improved. Namely, the device 104 compatibly implements improvement of the radiation efficiency and miniaturization.

An applied device which is formed by fixing the device 104 to the radiating fin 55 through the adhesive 81 can be brought into a product as a semiconductor module 126. Further, the device 104 employed for the module 126 is not restricted to a DIP type, but may alternatively have a package structure such as a four-way flat package structure, for example, in which external terminals 5 and 6 project from all side walls of the sealing resin 2.

7. Seventh Embodiment

Figure 12:
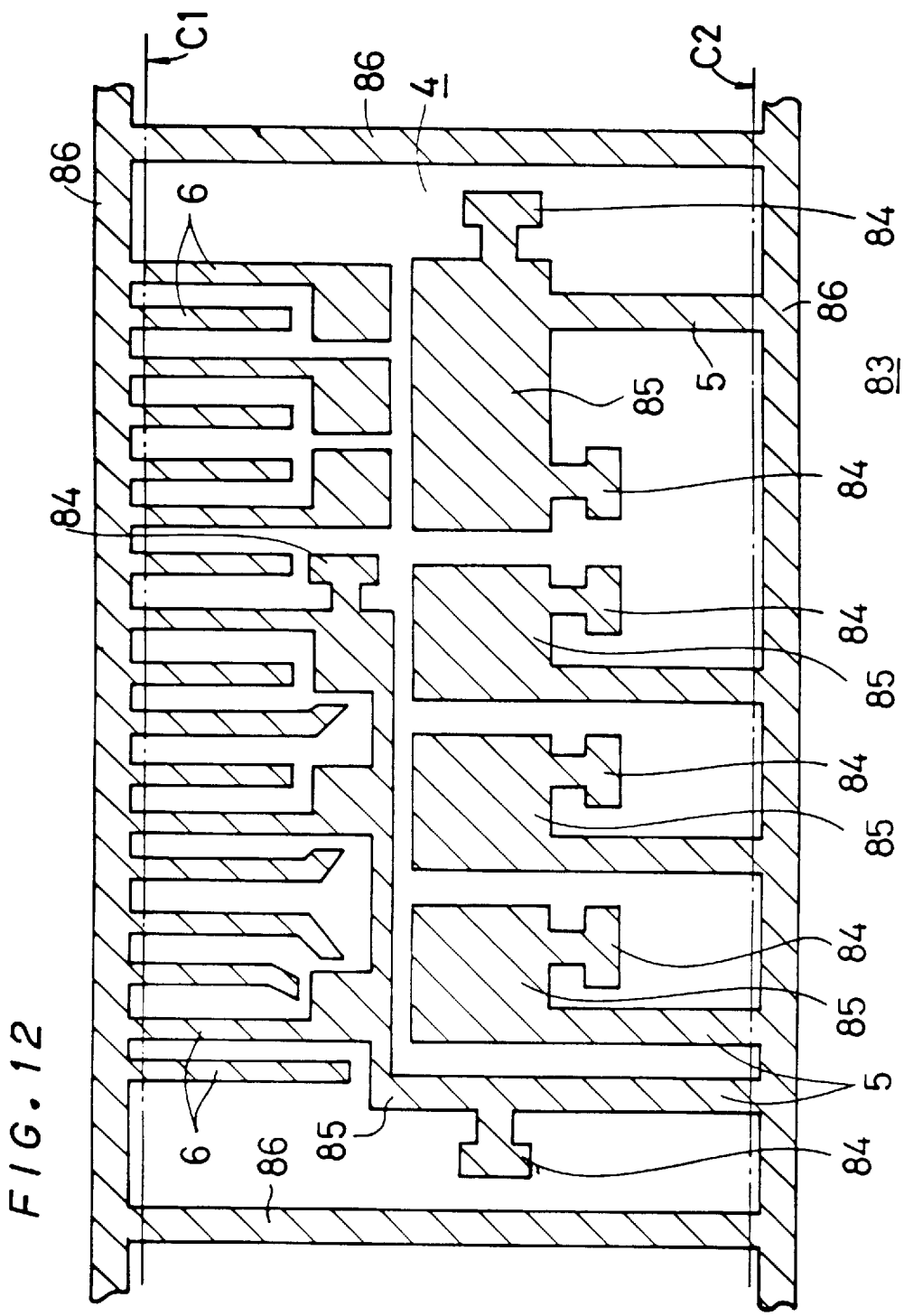
FIG. 12 is a plan view showing a lead frame of a device according to an embodiment 7.

FIG. 12 is a plan view of a lead frame 83 which is integrated into a semiconductor device according to a seventh embodiment 7. In particular, this figure shows a shape before being integrated into the semiconductor device, i.e., before being sealed with sealing resin. As shown in FIG. 12, all parts of the lead frame 83 are integrally coupled with each other by tie bars 86 before the sealing step. After sealing is completed, the tie bars 86 are cut along cutting lines C1 and C2. Consequently, external terminals 5 and 6 are cut off from the tie bars 86, so that the lead frame 83 is separated into some island regions which are isolated from each other.

In the lead frame 83, dummy projections 84 which are not related to electric connection are provided on portions of edges forming the plane contour of a wiring pattern 4 which is a portion filled up with sealing resin. Among the island regions forming the lead frame 83, those occupying large areas easily cause interfacial separation between the same and sealing resin 2. The dummy projections(projections) 84 are selectively provided on island regions 85 occupying areas larger than a certain area, i.e., those easily causing interfacial separation.

The dummy projections 84 are preferably selected in such shapes that the widths of forward end portions thereof are larger than those of base portions toward the island regions 85. In particular, T shapes illustrated in FIG. 12 or hook shapes such as L shapes are preferable. In any plane shapes, the dummy projections 84 are simultaneously formed when the lead frame 83 is formed by punching out a plate member into a prescribed pattern shape. Namely, no specific step is required in order to add the dummy projections 84 to the lead frame 83.

Figure 13:
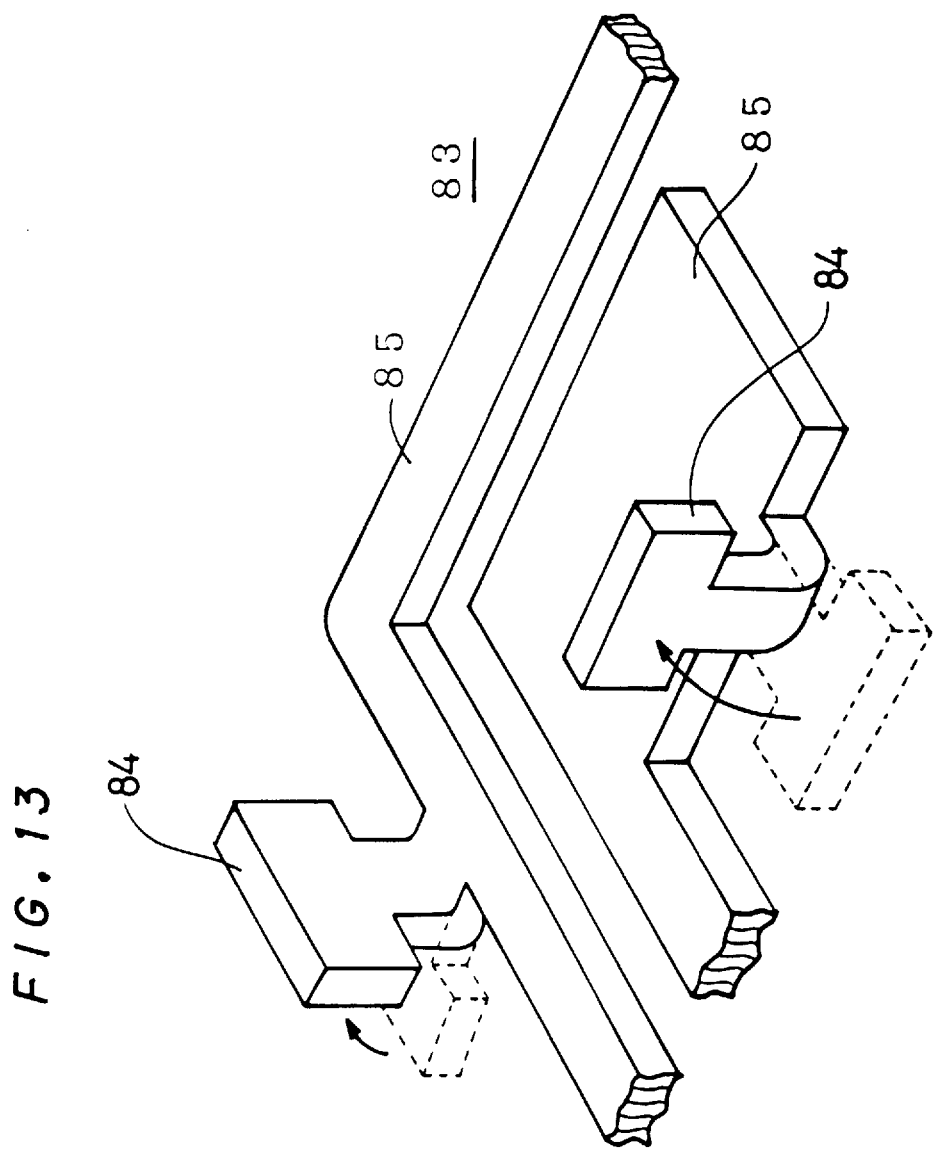
FIG. 13 is a partial perspective view showing the lead frame of the device according to the embodiment 7.

FIG. 13 is a step diagram showing a step of bending the lead frame 83 which is executed in advance of the sealing step. In this step, bending is so performed that the dummy projections 84 are uprighted with respect to the major surface of the lead frame 83. Preferably, this step is executed before an IGBT element 1, a control semiconductor element 16 and the like are fixed to the lead frame 83.

Figure 14:
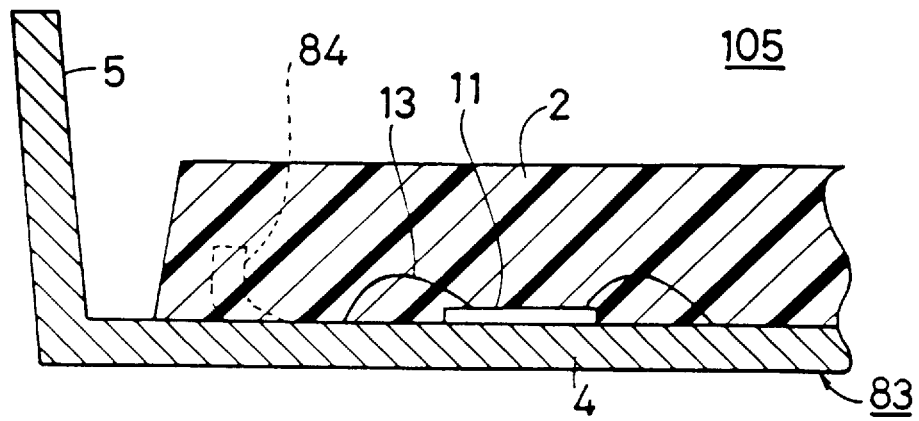
FIG. 14 is a front sectional view of the device according to the embodiment 7.

FIG. 14 is a front sectional view showing the internal structure of a semiconductor device 105 employing the lead frame 83. As shown in FIG. 14, each dummy projection 84 is embedded in the sealing resin 2 while being uprighted from the major surface of the lead frame 83. The uprighted dummy projection 84, which is enclosed with the sealing resin 2 in a close contact manner, prevents each island region 85 which is coupled with the dummy projection 84 from causing interfacial separation between the same and the sealing resin 2.

Namely, each dummy projection 84 is adapted to improve adhesion between the lead frame 83 and the sealing resin 2. When each dummy projection 84 is in a hook shape, the effect of stoppage of the dummy projection 84 in the sealing resin 2 is particularly remarkable and hence the adhesion between the lead frame 83 and the sealing resin 2 is further improved.

As hereinabove described, the lead frame 83 comprises the dummy projections 84 in the device 105, whereby the adhesion between the lead frame 83 and the sealing resin 2 is advantageously guaranteed although one major surface of the lead frame 83 is exposed toward the exterior.

8. Eighth Embodiment

Figure 15:
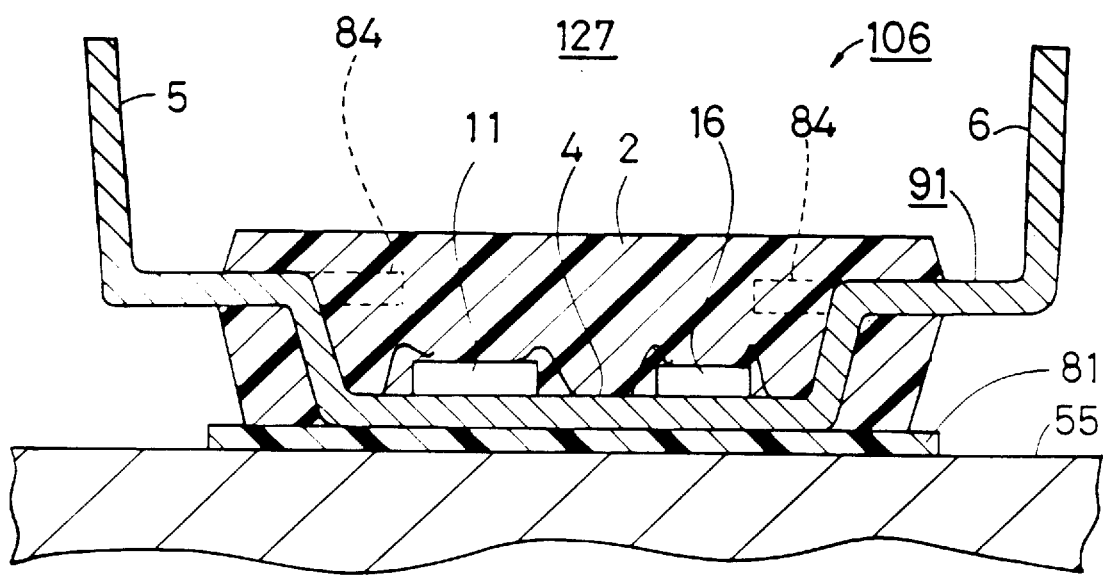
FIG. 15 is a front sectional view of a device and a module according to an embodiment 8.

FIG. 15 is a front sectional view showing a device 106 which is a semiconductor device according to a eighth embodiment and a semiconductor module 127 into which the device 106 is integrated. A lead frame 91 provided on the device 106 has stepwise bent portions in portions which are approximate to external terminals 5 and 6 respectively in a region corresponding to a wiring pattern 4 sealed with sealing resin 2. The lead frame 91 is embedded in the sealing resin 2 in these bent portions.

Further, the lead frame 91 is flat in a region which is held between the two bent portions. Various types of elements such as an IGBT element 11 and a control semiconductor element 16 are loaded on the flat region. A major surface which is opposite to the element carrying surface of the flat region is exposed to the exterior of the sealing resin 2. Thus, the major surface of the lead frame 91 is not exposed to the exterior of the sealing resin 2 over all regions thereof but a partial region is embedded in the sealing resin 2 in the device 106, whereby high adhesion can be advantageously attained between the lead frame 91 and the sealing resin 2.

As shown in FIG. 15, the flat region of the lead frame 91 is bonded to a flat surface of a radiating fin 55 through an adhesive 81. Thus, the IGBT element 11 is loaded on a portion of the lead frame 91 which is in contact with the radiating fin 55 in the device 106, whereby radiation efficiency for heat loss bears comparison with that of the device 105 according to the seventh embodiment.

Due to provision of the bent portions, further, external terminals 5 and 6 are retracted from the exposed surface of the flat region of the lead frame 91. Thus, the external terminals 5 and 6 are positioned above the flat surface of the radiating fin 55 with considerable distances. Namely, some degrees of spatial distances are ensured between the external terminals 5 and 6 and the radiating fin 55. Therefore, it is not necessary to widely apply the adhesive 81 to the flat surface of the radiating fin 55 including the regions immediately under the external terminals 5 and 6, in order to prevent discharging across the external terminals 5 and 6 and the radiating fin 55. Namely, a step of attaching the device 106 to the radiating fin 55 is advantageously simplified.

As illustrated in FIG. 15, further, adhesion between the lead frame 91 and the sealing resin 2 is further improved by providing dummy projections 84 also on the lead frame 91. In this device 106, further, the various types of elements such as the IGBT element 11 and the control semiconductor element 16 are loaded on the flat region of the lead frame 91, whereby a step of fixing these elements onto the lead frame 91 in fabrication of the device is advantageously simple, similarly to the devices 101 to 105.

9. Ninth Embodiment

Figure 16:
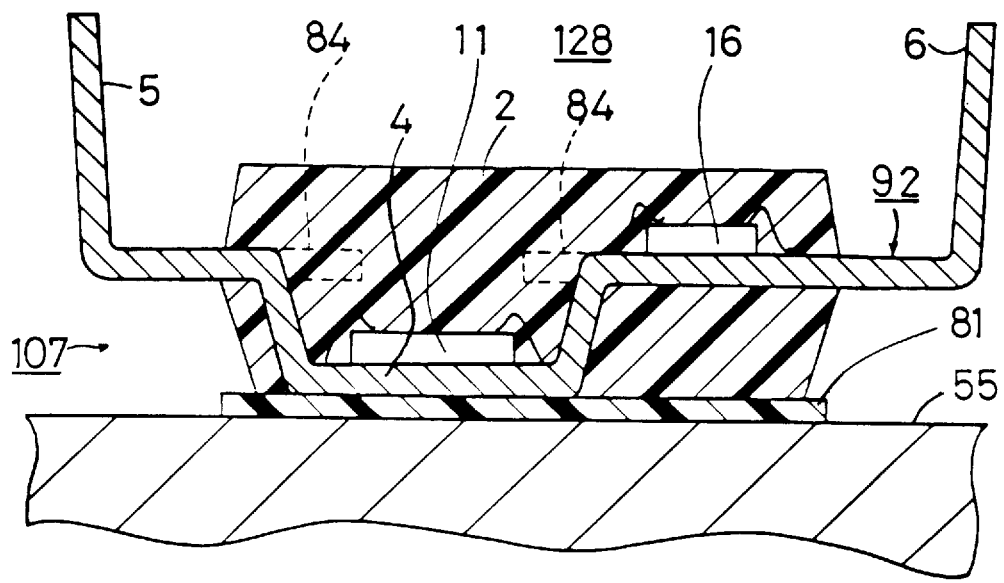
FIG. 16 is a front sectional view of a device and a module according to an embodiment 9.

FIG. 16 is a front sectional view showing a device 107 which is a semiconductor device according to a ninth embodiment and a semiconductor module 128 into which the device 107 is integrated. A lead frame 92 provided on the device 107 has stepwise bent portions similarly to the lead frame 91. However, a region corresponding to a wiring pattern 4 has those two flat regions about the bent portions which are parallel to each other.

These flat regions have some degrees of widths respectively, so that an element such as an IGBT element 11 accompanied with heat generation and an element such as a control semiconductor element 16 accompanied with no heat generation are fixed to these flat surfaces respectively. A major surface of the lead frame 92 which is opposite to the element carrying surface is exposed toward the exterior of the sealing resin 2 only on one of the two flat regions in the region corresponding to the wiring pattern 4. The IGBT element 11 accompanied with heat generation is fixed to the exposed flat region.

Also in this device 107, high adhesion is attained between the head frame 92 and the sealing resin 2, similarly to the device 106. As illustrated in FIG. 16, further, the adhesion is further improved by provision of dummy projections 84, also similarly to the above. Further, the IGBT element 11 is selectively fixed to the portion of the lead frame 92 exposing the major surface, whereby radiation efficiency is excellent similarly to the device 106. In addition, external terminals 5 and 6 are upwardly separated from the radiating fin 55, whereby insulation between the external terminals 5 and 6 and the radiating fin 55 can be readily ensured, also similarly to the device 106.

10. Modifications (1) In the above description, examples of semiconductor modules which are formed by mounting semiconductor devices on the circuit substrates 71 have been illustrated only in the embodiments 4 and 5. However, a semiconductor module which is formed by combining the semiconductor module 121 of the embodiment 1 with the circuit substrate 71 and the case 72, for example, can also be brought into a product as a useful module, similarly to the modules 124 and 125 according to the embodiments 4 and 5. This also applies to the semiconductor modules of the remaining embodiments.

(2) In each of the aforementioned embodiments, the semiconductor device comprises the control circuit 15, which has the driving circuit and the protective circuit as a preferred embodiment. In general, however, the elements such as the control semiconductor element 16 provided on the control circuit 15 may form only a driving circuit. In this case, the IGBT element 11 requires no sense electrode S in the circuit diagram of FIG. 2. Further, those of the plurality of wires 14 coupling the collector electrode C and the sense electrode S with the control circuit 15 are unnecessary. Further, parts of the plurality of external terminals 6 are unnecessary either.

In addition, the semiconductor device may comprise only the power circuit 10, with no presence of the control circuit 15 in general. In addition, the semiconductor device may comprise only a power semiconductor element such as the IGBT element 11.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a lead frame being electrically conductive and in the form of a sheet having first and second major surfaces and provided with a plurality of external terminals outwardly projecting;
   a power semiconductor element being fixed to said first major surface;
   electric insulating sealing resin for sealing said power semiconductor element and said lead frame so as to outwardly expose said external terminals,
   said sealing resin being provided with neither hole nor slit for receiving a screw for fastening said sealing resin to external radiating means; and
   a heat sink, being heat conductive and in the form of a plate having third and fourth major surfaces, being so provided that said third major surface is opposed to said second major surface with a space,
   said sealing resin also sealing said heat sink so as to outwardly expose said fourth major surface;
   wherein a retreating portion being depressed stepwise is formed in a surface of said sealing resin being opposite to said fourth major surface in which a member is provided to secure said semiconductor device to said external radiating means.

2. The semiconductor device in accordance with claim 1, wherein
   said retreating portion is a groove extending from a first end to a second end of said surface in the form of a strip along a center line equally dividing said surface.

3. The semiconductor device in accordance with claim 1, wherein
   said retreating portion is a depression being formed in a central portion of said surface.

4. The semiconductor device in accordance with claim 1, wherein
   said retreating portion is formed by two depressions being separated into opposite ends of said surface.

5. A semiconductor device comprising:
   a lead frame being electrically conductive and in the form of a patterned sheet having first and second major surfaces and provided with a plurality of external terminals outwardly projecting, wherein said lead frame is patterned from a flat sheet;
   a power semiconductor element being fixed to said first major surface; and
   electric insulating sealing resin for sealing said power semiconductor element and said lead frame so as to outwardly expose said external terminals,
   said sealing resin being provided with neither hole nor slit for receiving a screw for fastening said sealing resin to external radiating means;
   wherein said lead frame is flat in a region including a portion to which said power semiconductor element is fixed and said second major surface is so outwardly exposed in said region to be capable of contacting a flat surface of said external radiating means in said region, and said lead frame further has bent portions defining a step between said region and said external terminals so that said external terminals at least maintain a distance from said flat surface of said external radiating means, said bent portion being embedded in said sealing resin.

6. A semiconductor device comprising:
   a lead frame being electrically conductive and in the form of a patterned sheet having first and second major surfaces and provided with a plurality of external terminals outwardly projecting, wherein said lead frame is patterned from a flat sheet;
   a power semiconductor element being fixed to said first major surface; and
   electric insulating sealing resin for sealing said power semiconductor element and said lead frame so as to outwardly expose said external terminals,
   said sealing resin being provided with neither hole nor slit for receiving a screw for fastening said sealing resin to external radiating means;
   wherein said lead frame is flat in a region including a portion to which said power semiconductor element is fixed, and said lead frame further has a projection being uprighted from said first or second major surface in an edge portion forming contours of said first and second major surfaces, said projection being embedded in said sealing resin;

said second major surface being outwardly exposed in said region to be capable of contacting a flat surface of said external radiating means in said region.

7. The semiconductor device in accordance with claim 5, further comprising a control semiconductor element for controlling the operation of said power semiconductor element, said control semiconductor element being fixed to said first major surface in said region.

8. The semiconductor device in accordance with claim 6, wherein said lead frame is flat over all regions excluding said external terminals, said second major surface being outwardly exposed over said all regions.

9. The semiconductor device in accordance with claim 6, wherein the width of a forward end portion of said projection is larger than that of its base portion.

10. The semiconductor device in accordance with claim 9, wherein said projection is in the form of a hook having an extension on said forward end portion.

11. The semiconductor device in accordance with claim 9, wherein said lead frame is divided into a plurality of island regions being isolated from each other, said projection being selectively provided in at least one of said plurality of island regions which occupies an area in excess of a predetermined magnitude.

12. A semiconductor module comprising a semiconductor device and a radiating means having heat conductivity and a flat surface, wherein said semiconductor device comprises:

a lead frame being electrically conductive and in the form of a sheet having first and second major surfaces and provided with a plurality of external terminals outwardly projecting, a power semiconductor element being fixed to said first major surface, a heat sink being heat conductive and in the form of a plate having third and fourth major surfaces, being so provided that said third major surface is opposed to said second major surface with a space, and a sealing resin having electrically insulating properties for sealing said power semiconductor element, said lead frame and said heat sink so as to outwardly expose said external terminals and said fourth major surface, a retreating portion depressed stepwise being formed in a surface of said sealing resin being opposite to said fourth major surface, said fourth major surface being in contact with said flat surface of said radiating means, said semiconductor module further comprising a support member being engaged with and pressing said retreating portion against said flat surface, thereby fixing said semiconductor device to said radiating means while keeping said fourth major surface in contact with said flat surface.

13. The semiconductor module in accordance with claim 12, wherein said support member is a clamper being in the form of a band plate, first and second end portions of said clamper being fixed to said radiating means and engaged with said retreating portion respectively.

14. A semiconductor module comprising a semiconductor device and a radiating means having heat conductivity and a flat surface wherein said semiconductor device comprises:

a lead frame being electrically conductive and in the form of a sheet having first and second major surfaces and provided with a plurality of external terminals outwardly projecting, a power semiconductor element being fixed to said first major surface, a heat sink being heat conductive and in the form of a plate having third and fourth major surfaces being so provided that said third major surface is opposed to said second major surface with a space and a sealing resin having electrically insulating properties for sealing said power semiconductor element, said lead frame and said heat sink so as to outwardly expose said external terminals and said fourth major surface, said fourth major surface being in contact with said flat surface of said radiating means, said semiconductor module further comprising a support member pressing a surface of said sealing resin being opposite to said fourth major surface against said flat surface, thereby fixing said semiconductor device to said radiating means while keeping said fourth major surface in contact with said flat surface, a circuit substrate to which a circuit element is fixedly connected along with said semiconductor device, and a case for storing said circuit substrate, said radiating means being fixed to said case, said support member being a clamper being in the form of a band plate, first and second end portions of said clamper being fixed to an inner wall of said case and in contact with said surface of said sealing resin respectively.

15. A semiconductor nodule comprising a semiconductor device and a radiating means having heat conductivity and a flat surface, wherein said semiconductor device comprises:

a lead frame being electrically conductive and in the form of a sheet having first and second major surfaces and provided with a plurality of external terminals outwardly projecting.

a power semiconductor element being fixed to said first major surface, a heat sink being heat conductive and in the form of a plate having third and fourth major surfaces, being so provided that said third major surface is opposed to said second major surface with a space, and a sealing resin having electrically insulating properties for sealing said power semiconductor element, said lead frame and said heat sink so as to outwardly expose said external terminals and said fourth major surface, said fourth major surface being in contact with said flat surface of said radiating means, said semiconductor module further comprising a support member pressing a surface of said sealing resin being opposite to said fourth major surface against said flat surface, thereby fixing said semiconductor device to said radiating means while keeping said fourth major surface in contact with said flat surface a circuit substrate to which a circuit element is fixedly connected along with said semiconductor device, and a case for storing said circuit substrate, said circuit substrate being positioned on a side being opposite to said radiating means through said semiconductor device and selectively defining an opening in a portion being opposed to said surface of said sealing resin, said radiating means being fixed to said case, said support member being an elastic body being freely inserted in said opening and having first and second end portions being fixed to an inner wall of said case in contact with said surface of said sealing resin respectively.

\* \* \* \* \*